(12) United States Patent
Zong

(10) Patent No.: US 11,154,903 B2
(45) Date of Patent: Oct. 26, 2021

(54) APPARATUS AND METHOD FOR SURFACE COATING BY MEANS OF GRID CONTROL AND PLASMA-INITIATED GAS-PHASE POLYMERIZATION

(71) Applicant: Jiangsu Favored Nanotechnology Co., Ltd., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 16/992,574

(22) Filed: Aug. 13, 2020

(65) Prior Publication Data

US 2020/0368776 A1 Nov. 26, 2020

Related U.S. Application Data

(63) Continuation-in-part of application No. 15/762,081, filed as application No. PCT/CN2016/105126 on Nov. 8, 2016, now abandoned.

(30) Foreign Application Priority Data

May 13, 2016 (CN) .......................... 201610319573.X

(51) Int. Cl.
*H01J 37/32* (2006.01)
*B05D 1/00* (2006.01)
*C23C 16/50* (2006.01)

(52) U.S. Cl.
CPC ................ *B05D 1/62* (2013.01); *B05D 1/60* (2013.01); *C23C 16/50* (2013.01);
(Continued)

(58) Field of Classification Search
CPC ..... H01J 37/32449; C23C 14/54; C23C 16/00; C23C 14/00; C08F 2/52; C09D 4/00
(Continued)

(56) References Cited

U.S. PATENT DOCUMENTS 4,890,575 A * 1/1990 Ito .............................. C23G 5/00
118/723 HC
5,036,252 A * 7/1991 Lob ......................... H01J 37/08
315/111.31
(Continued)

FOREIGN PATENT DOCUMENTS

CN 1190545 C 2/2005
CN 1946488 A 4/2007
(Continued)

*Primary Examiner* — Rudy Zervigon
(74) *Attorney, Agent, or Firm* — Muncy, Geissler, Olds & Lowe, P.C.

(57) ABSTRACT

An apparatus and a method for surface coating by means of grid control and plasma-initiated gas-phase polymerization. The method comprises: dividing a vacuum chamber into a discharging cavity (2) and a processing chamber (3) by using a metal grid mesh (1), the metal grid mesh (1) being insulated from the vacuum chamber; separately feeding carrier gas and monomer steam into the discharging cavity (2) and the processing chamber (3) through different pipes (4, 5), putting a substrate to be processed (11) in the processing chamber (3), and generating in the discharging cavity (2) plasma that continuously discharges; and applying pulse positive bias to the metal grid mesh (1), to release the plasma into the processing chamber (3) to initiate monomer polymerization.

16 Claims, 3 Drawing Sheets

(52) U.S. Cl.
CPC .... *H01J 37/3299* (2013.01); *H01J 37/32449* (2013.01); *H01J 2237/3321* (2013.01)

(58) Field of Classification Search
USPC ............... 118/723 HC, 723 FE, 723 FI; 156/345.43, 345.44, 345.45, 345.46, 156/345.47, 345.48
See application file for complete search history.

(56) References Cited

U.S. PATENT DOCUMENTS

| | | | | |
|---|---|---|---|---|
| 5,122,431 | A * | 6/1992 | Kodama | C23C 16/517 430/128 |
| 5,211,994 | A * | 5/1993 | Tsukazaki | C23C 14/54 427/523 |
| 5,350,480 | A * | 9/1994 | Gray | H01L 21/02071 134/31 |
| 5,453,124 | A * | 9/1995 | Moslehi | C23C 16/45561 118/715 |
| 5,455,061 | A * | 10/1995 | Matossian | C23C 14/54 427/8 |
| 5,518,572 | A * | 5/1996 | Kinoshita | G21K 1/14 118/723 E |
| 5,537,005 | A * | 7/1996 | Goebel | H01J 3/025 250/427 |
| 5,571,332 | A * | 11/1996 | Halpern | C23C 14/22 118/723 HC |
| 5,990,476 | A * | 11/1999 | Larson | H01J 37/026 250/251 |
| 6,083,363 | A * | 7/2000 | Ashtiani | H01J 37/32357 204/298.01 |
| 6,653,179 | B1 * | 11/2003 | Minegishi | H01L 21/2026 438/166 |
| 6,830,007 | B2 * | 12/2004 | Matsuki | H01J 37/32357 118/723 E |
| 6,949,735 | B1 * | 9/2005 | Hatakeyama | H01J 27/16 250/251 |
| 7,001,831 | B2 * | 2/2006 | Niira | C23C 16/345 438/485 |
| 7,244,474 | B2 * | 7/2007 | Hanawa | C23C 16/402 118/723 ER |
| 7,321,198 | B2 * | 1/2008 | Kubota | H01J 27/16 250/423 R |
| 7,695,590 | B2 * | 4/2010 | Hanawa | C23C 16/507 156/345.39 |
| 7,718,978 | B2 * | 5/2010 | Yamashita | H01J 37/08 250/423 R |
| 8,703,586 | B2 * | 4/2014 | Ito | H01L 31/18 438/478 |
| 9,157,152 | B2 * | 10/2015 | Faguet | C23C 16/452 |
| 9,373,517 | B2 * | 6/2016 | Yang | H01J 37/32146 |
| 9,416,450 | B2 * | 8/2016 | Nguyen | C23C 16/45565 |
| 10,014,192 | B2 * | 7/2018 | Singh | H01J 37/32458 |
| 2002/0160553 | A1 * | 10/2002 | Yamanaka | H01L 29/66772 438/149 |
| 2003/0013280 | A1 * | 1/2003 | Yamanaka | H01L 29/78675 438/487 |
| 2003/0148565 | A1 * | 8/2003 | Yamanaka | H01L 21/02532 438/200 |
| 2003/0176011 | A1 * | 9/2003 | Niira | C23C 16/50 438/96 |
| 2003/0193295 | A1 * | 10/2003 | Kaufman | H01J 27/14 315/111.81 |
| 2004/0070348 | A1 | 4/2004 | Hirokuni et al. | |
| 2004/0074604 | A1 * | 4/2004 | Ichiki | H01J 37/321 156/345.39 |
| 2004/0149211 | A1 * | 8/2004 | Ahn | C23C 16/45565 118/715 |
| 2004/0222389 | A1 * | 11/2004 | Swenson | C23C 14/221 250/492.21 |
| 2005/0211171 | A1 * | 9/2005 | Hanawa | C23C 16/045 118/723 R |
| 2006/0009017 | A1 * | 1/2006 | Sembommatsu | H01L 21/02686 438/488 |
| 2006/0254513 | A1 * | 11/2006 | Kang | C23C 16/46 118/715 |
| 2006/0254514 | A1 * | 11/2006 | Kang | C23C 16/44 118/715 |
| 2007/0068624 | A1 * | 3/2007 | Jeon | H01J 37/321 156/345.4 |
| 2007/0163994 | A1 * | 7/2007 | Rauf | H01J 37/32357 216/62 |
| 2007/0259130 | A1 * | 11/2007 | Von Kaenel | C23C 16/45565 427/569 |
| 2008/0050523 | A1 * | 2/2008 | Kitazoe | C23C 16/345 427/255.26 |
| 2008/0085604 | A1 * | 4/2008 | Hoshino | H01L 21/31116 438/712 |
| 2008/0164820 | A1 * | 7/2008 | Osada | H01J 27/08 315/111.61 |
| 2009/0205570 | A1 * | 8/2009 | Kang | C23C 16/44 118/715 |
| 2010/0028529 | A1 * | 2/2010 | Yamanaka | G11B 5/8404 427/127 |
| 2010/0062613 | A1 * | 3/2010 | Kim | H01L 21/31608 438/778 |
| 2012/0091914 | A1 * | 4/2012 | Hansen | H02H 3/247 315/307 |
| 2012/0171849 | A1 * | 7/2012 | Ito | C23C 16/5096 438/478 |
| 2012/0252195 | A1 * | 10/2012 | Jones | H01J 37/3171 438/514 |
| 2012/0258601 | A1 * | 10/2012 | Holland | H01J 37/04 438/729 |
| 2012/0258606 | A1 * | 10/2012 | Holland | H01J 37/32596 438/798 |
| 2012/0258607 | A1 * | 10/2012 | Holland | H01J 37/32357 438/798 |
| 2013/0280860 | A1 * | 10/2013 | Tellez Oliva | H01L 21/02527 438/105 |
| 2014/0113084 | A1 * | 4/2014 | Nguyen | C23C 16/276 427/585 |
| 2014/0352615 | A1 * | 12/2014 | Kabasawa | H01J 37/3171 118/712 |
| 2015/0206774 | A1 * | 7/2015 | Singh | H01J 37/32899 156/345.35 |
| 2015/0325413 | A1 * | 11/2015 | Kim | H01J 37/32449 315/111.21 |
| 2016/0056017 | A1 * | 2/2016 | Kim | H01J 37/321 156/345.28 |
| 2016/0076142 | A1 * | 3/2016 | Sheng | H01J 37/08 438/766 |
| 2016/0240353 | A1 * | 8/2016 | Nagami | H01J 37/32568 |
| 2018/0247797 | A1 * | 8/2018 | Gorokhovsky | C23C 16/442 |
| 2018/0330922 | A1 * | 11/2018 | Zong | C09D 4/00 |

FOREIGN PATENT DOCUMENTS

| | | |
|---|---|---|
| CN | 102024658 A | 4/2011 |
| CN | 102821873 A | 12/2012 |
| CN | 205616834 U | 10/2016 |

\* cited by examiner

APPARATUS AND METHOD FOR SURFACE COATING BY MEANS OF GRID CONTROL AND PLASMA-INITIATED GAS-PHASE POLYMERIZATION

CROSS REFERENCE TO RELATED APPLICATIONS

The present application is a continuation-in-part of co-pending application Ser. No. 15/762,081, filed on 21 Mar. 2018, for which priority is claimed under 35 U.S.C. § 120; the co-pending application Ser. No. 15/762,081 is the US national stage of International Patent Application PCT/CN2016/105126 filed on Nov. 8, 2016, which, in turn, claims priority to Chinese Patent Application CN 201610319573.X filed on May 13, 2016 under 35 U.S.C. § 119; the entire contents of all of which are hereby incorporated by reference.

TECHNICAL FIELD

The present invention belongs to the plasma technology field, relating to an apparatus and method for initiated vapor polymerization surface coating by grid-controlled plasma, which can be used for preparation of polymer coatings on the surfaces of the base materials.

BACKGROUND

Plasma polymerization is a method which discharges organic monomer vapors so that various active species can be produced, and polymers form from the adding reactions among these active species as well as the monomers. The plasma polymerization can be classified into two forms: plasma state polymerization and plasma initiated polymerization. The difference between the two forms is that: in the plasma state polymerization, the monomer is completely exposed to the plasma environment in the entire reaction process, while in the plasma initiated polymerization, the plasma exists only shortly by a short time glow discharge in which active nucleus form from gaseous reactions of the monomer vapors, which initiate continuous polymerization of the monomer vapors in the subsequent long time no plasma period. Compared with the problems of the plasma state polymerization coating layers such as complicated structure, poor reaction reproducibility and deterioration of a processing effect with time, the plasma initiated polymerization can result in polymer coatings of unified structure with one-dimensional large polymer molecules, due to less destruct the structure and remain good performance of the monomers. On the other hand, by grafting reactions with the surface of the base material, the adhesion between the coating layer and the base material can be enhanced, so that the coating effect does not deteriorate with time.

The existing plasma initiated polymerization techniques are realized by pulse modulated high frequency glow discharge. For example, the literature "surface coating" (CN 1190545C) disclosed a hydrophobic/oleophobic base material, which includes a method of preparation of polymer coating by pulse modulated high frequency glow discharge. The literature "method for exerting conformal nanocoating through a low pressure plasma technology" (CN201180015332.1) also relates to a method of preparation of a polymer coating through pulse modulated high frequency glow discharge. All of these existing technologies adopt pulse modulated high frequency glow discharge because high frequency discharge can avoid the discharge extinction due to the insulation of the electrode by the polymer formations on it (high frequency discharges can continue even if the electrode being insulated by polymer formations), while the pulse modulation which periodically turn on/off the high frequency discharge satisfies the condition of short-time discharge and long-time non-discharge polymerization required for the plasma initiated polymerization. To minimize monomer fragments generated by the action of the plasma on the monomers in the pulse-on discharge period, the time of the pulse-on discharge period should be as short as possible (the time of plasma action has been shortened to tens of microseconds in the existing technologies). However, the existing technologies based on the pulse modulated high frequency glow discharge need to use high frequency power supplies with pulse modulation function, which has the disadvantages that: the high frequency power supplies with pulse modulation function are complicated in structure, high cost and tricky commisioning; the plasma is unstable; and the action time of the plasma cannot be further shortened because it requires at least tens of microseconds for the plasma to be initiated and established.

SUMMARY

The technical problem to be solved by the present invention is to provide an apparatus and method for initiated vapor polymerization surface coating by grid-controlled plasma, so as to solve the problems of the existing technologies which include complicated power supply structure, high cost, tricky commissioning, unstable plasma and incapable of further shorten the plasma action time to be shorter than tens of microseconds.

The technical solution adopted for achieving the above purpose in the present invention is as follows: an apparatus for initiated vapor polymerization surface coating by grid-controlled plasma, wherein a vacuum chamber is divided into two parts: a discharging cavity and a processing chamber, by a metal mesh grid; the metal mesh grid is connected with a pulse bias power supply; the metal mesh grid is insulated from the vacuum chamber; the discharging cavity is respectively connected with a carrier gas pipeline and a filament electrode; the filament electrode is connected with a power supply; the side of the processing chamber which is capable of placing the to-be-processed base material and away from the discharging cavity is connected with one end of an exhaust pipe; the other end of the exhaust pipe is connected with a vacuum pump; the side of the processing chamber which is near the discharging cavity is connected with a monomer vapor pipeline; and the processing chamber is connected with a vacuum exhaust hole.

The metal mesh grid is made by weaving ordinary steel wire or stainless steel wire of nickel wire or copper wire, or made by drilling holes on ordinary steel sheet or stainless steel sheet or nickel sheet or copper sheet; the diameter of a mesh wire of the metal mesh grid is 0.02-0.5 mm; and the size of meshes is 0.1-1 mm.

A method for initiated vapor polymerization surface coating by grid-controlled plasma comprises the following steps:
1) placing the to-be-processed base material in the processing chamber;
2) flowing the carrier gas into the discharging cavity through the carrier gas pipeline, and flowing the monomer vapor into the processing chamber through the monomer vapor pipeline; meanwhile, heating the filament electrode and applying high voltage by the power supply to generate continuous glow discharge in the discharging cavity, and applying positive pulse bias generated by the pulse bias power supply on the metal mesh grid;

3) generating stable plasma by continuous discharge in the discharging cavity; applying positive pulse bias on the metal mesh grid to control and release the plasma entering the processing chamber to initiate the monomer vapor to polymerize and deposit on the surface of the to-be-processed base material to form a polymer coating.

A structural unit of the monomer at least includes one unsaturated carbon carbon bond, and one unsaturated carbon atom does not include a substituent group.

The performance of the formed polymer coating keeps consistent with the nature of a characteristic functional group in the monomer structure.

The monomer comprises one or more of vinyl silane, vinyl alkane, acrylate alkane and methacrylate alkane.

The monomer structure includes halogen functional groups or other functional groups; the halogen functional groups are one or more of F, C, Br and I; and other functional groups are one or more of a hydroxyl group, a carboxyl group, an epoxy group and a silica group.

The plasma is generated through one or a combination of alternative voltage, radio frequency inductively coupling, microwave, filament and hot cathode methods.

The positive pulse bias has the amplitude of 10-150 V and the pulse width of 10-100 μs.

The carrier gas is one or a mixture of more of hydrogen, nitrogen, helium and argon.

The to-be-processed base material is one or a combination of more of plastics, rubber, an epoxy glass fiber board, a polymer coating, metal, paper, timber, glass and fabric; the surface of the to-be-processed base material can have a chemical coating; and the chemical coating is one of an acrylic resin coating, an alkyd resin coating and a polyurethane coating.

The characteristic functional group has natures of hydrophile, oleophobicity, acid base resistance and biological compatibility, and can also be used as a continuous blocking membrane for delaying corrosion.

In the present invention, the vacuum chamber is divided into two parts of the discharging cavity and the processing chamber by the metal mesh grid; the metal mesh grid is insulated from the vacuum chamber; the carrier gas and monomer vapor are flowed into the discharging cavity and the processing chamber, respectively, through different pipelines; the to-be-processed base material is put into the processing chamber; the plasma of continuous discharge is generated in the discharging cavity; and the plasma is released to the processing chamber by the positive pulse bias applied on the metal mesh grid, initiating the monomer vapor in the processing chamber to polymerize and deposit on the surface of the base material to form the polymer coating. The present invention has the advantages of simple power supply structure, low cost, easy commissioning, stable plasma and capability of shortening the action time of the plasma to the microsecond order.

In the figure:
1. metal mesh grid;
2. discharging cavity;
3. processing chamber;
4. carrier gas pipeline;
5. monomer vapor pipeline;
6. exhaust pipe;
7. vacuum pump;
8. power supply;
9. filament electrode;
10. pulse bias power supply;
11. current sensor.

DETAILED DESCRIPTION

Specific embodiments of the present invention are described below in detail in combination with the technical solution and drawings.

Embodiment 1

Figure 1:
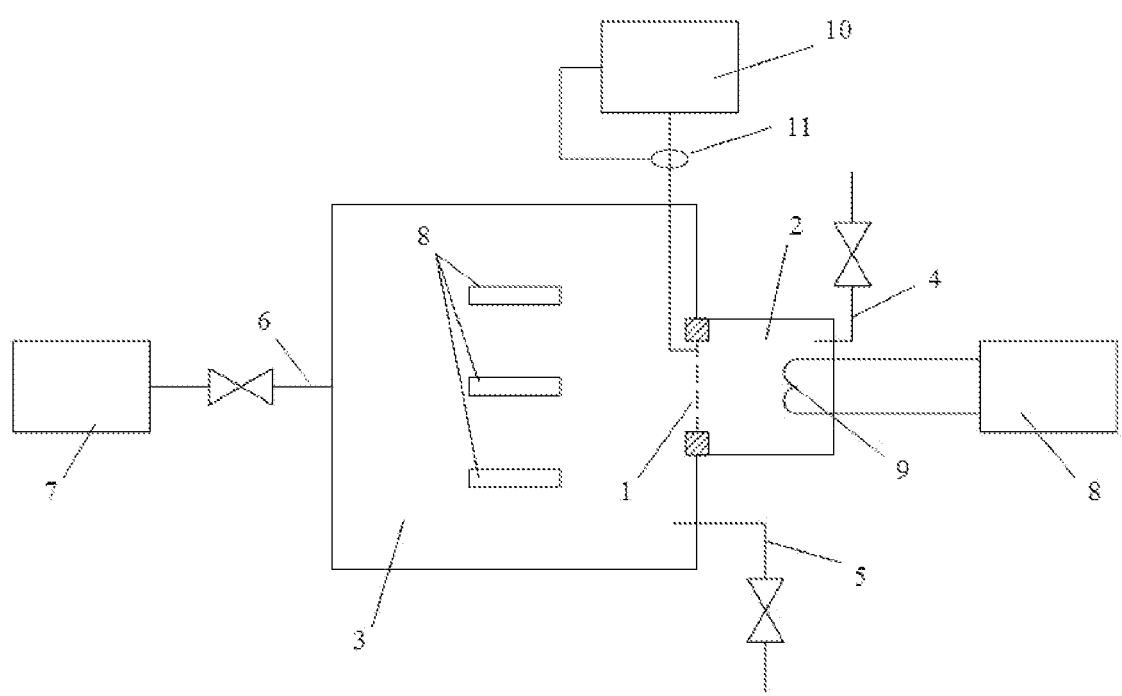
FIG. 1 is a structural schematic diagram of an apparatus for initiated vapor polymerization surface coating by grid-controlled plasma.

In an apparatus for initiated vapor polymerization surface coating by grid-controlled plasma as shown in FIG. 1, a vacuum chamber is divided into two parts: a discharging cavity 2 and a processing chamber 3 by a metal mesh grid 1; the metal mesh grid 1 is made by weaving ordinary steel wire; the diameter of a mesh wire of the metal mesh grid is 0.5 mm; and the size of meshes is 1 mm. the metal mesh grid 1 is connected with a pulse bias power supply 10 by a current sensor 11; the current sensor 11 measures the waveform of the current pulse and feeds it back to the pulse bias power source 10. According to the waveform of the current pulse, the pulse bias power source 10 adjusts its output to remain the width of the current pulse being consistent with the set value. the metal mesh grid 1 is insulated from the vacuum chamber; the discharging cavity 2 is respectively connected with a carrier gas pipeline 4 and a filament electrode 9; the filament electrode 9 is connected with a power supply 8; the processing chamber 3 is capable of placing to-be-processed base material; the side of the processing chamber 3 which is away from the discharging cavity 2 is connected with one end of an exhaust pipe 6; the other end of the exhaust pipe 6 is connected with a vacuum pump 7; the side of the processing chamber 3 which is near the discharging cavity 2 is connected with a monomer vapor pipeline 5; and the processing chamber 3 is connected with a vacuum exhaust hole.

Embodiment 2

A method for initiated vapor polymerization surface coating by using the apparatus for initiated vapor polymerization surface coating by grid-controlled plasma in embodiment 1 comprises the following steps:

1) placing the to-be-processed base material in the processing chamber 3;
2) flowing the carrier gas into the discharging cavity 2 through the carrier gas pipeline 4, and flowing the monomer vapor into the processing chamber 3 through the monomer vapor pipeline 5; meanwhile, heating the filament electrode 9 and providing high voltage by the power supply 8; generating continuous glow discharge in the discharging cavity 2; and applying positive pulse bias generated by the pulse bias power supply 10 to the metal mesh grid 1; and
3) generating a continuous discharged stable plasma in the discharging cavity 2; during the off-period of the positive pulse bias, the metal mesh grid 1 is automatically on the floating potential of the plasma to block the plasma from penetrating through the metal mesh grid 1 to enter the processing chamber 3; while the positive pulse bias is turned on, the potential of the metal mesh grid 1 is on a higher potential than the plasma potential in the discharging cavity, and the polymer coating on the metal mesh grid 1 is equivalent to a capacitor. Because the voltage on the capacitor cannot changed abruptly, the surface of the polymer coating on the metal mesh grid 1 is instantaneously at high potential, which enables the plasma to penetrate through the metal mesh grid 1 to diffuse into the processing chamber 3 to initiate polymerization of the monomer. As the polymer coating on the metal mesh grid 1 is charged by electrons in the plasma, the potential of the surface of the polymer is reduced until the potential is lower than the space potential of the plasma, then the plasma is blocked from entering the processing chamber 3.

A structural unit of the monomer includes one unsaturated carbon carbon bond, and one unsaturated carbon atom does not include a substituent group.

The performance of the formed polymer coating keeps consistent with the nature of a characteristic functional group in the monomer structure.

The monomer is vinyl dimethyl ethoxy silane (VDMES).

To achieve chemical performance applicable to application requirements, the monomer structure includes a halogen functional group, and the halogen functional group is F.

The plasma is generated by alternative voltage.

The positive pulse bias has amplitude of 10 V and pulse width of 10 μs.

The carrier gas is helium.

The to-be-processed base material is plastics; the surface of the to-be-processed base material has a chemical coating; and the chemical coating is an acrylic resin coating.

The characteristic functional group has natures of hydrophile, oleophobicity, acid base resistance and biological compatibility, and can also be used as a continuous blocking membrane for delaying corrosion.

Embodiment 3

The structure of each part and connection relationships of the apparatus for initiated vapor polymerization surface coating by grid-controlled plasma in the present embodiment are identical with those in embodiment 1. Different technical parameters are as follows:
1) The metal mesh grid 1 is made by weaving the nickel wire.
2) The diameter of the mesh wire of the metal grid mesh is 0.02 mm; and the size of meshes is 0.1 mm.

Embodiment 4

The present embodiment describes a method for initiated vapor polymerization surface coating by using the apparatus for initiated vapor polymerization surface coating by grid-controlled plasma in embodiment 3. Contents of each step are identical with those of embodiment 2, and different technical parameters are as follows:
1) The structural unit of the monomer includes two unsaturated carbon carbon bonds.
2) The monomers are acrylic acid (AA) and methacrylic acid (MAA).
3) The structures of the monomers include carboxyl groups.
4) The plasma is generated by radio frequency inductively coupling.
5) The carrier gas is a mixture of hydrogen and nitrogen.
6) The positive pulse bias has the amplitude of 80 V and the pulse width of 55 μs.
7) The to-be-processed base material is an epoxy glass fiber board and paper.
8) The chemical coating on the surface of the to-be-processed base material is an alkyd resin coating.

Embodiment 5

The structure of each part and connection relationships of the apparatus for initiated vapor polymerization surface coating by grid-controlled plasma in the present embodiment are identical with those in embodiment 1 and embodiment 3. Different technical parameters are as follows:
1) The metal mesh grid 1 is made by drilling the copper sheet.
2) The size of meshes of the metal mesh grid is 0.5 mm.

Embodiment 6

The present embodiment describes a method for initiated vapor polymerization surface coating by using the apparatus for initiated vapor polymerization surface coating by grid-controlled plasma in embodiment 5. Contents of each step are identical with those of embodiment 2 and embodiment 4, and different technical parameters are as follows:
1) The structural unit of the monomer includes three unsaturated carbon carbon bonds.
2) The monomers are methyl methacrylate (MMA), 2-hydroxyethyl methacrylate (HEMA) and n-octyl methacrylate (PAMOE).
3) The structures of the monomers include CI, Br, I, hydroxyl group and carboxyl group.
4) The plasma is generated through a combination of microwave, filament and hot cathode methods.
5) The carrier gas is a mixture of helium and argon.
6) The positive pulse bias has the amplitude of 150 V and the pulse width of 100 μs.
7) The to-be-processed base material is metal, glass and fabric.
8) The chemical coating on the surface of the to-be-processed base material is a polyurethane coating.

Figure 2:
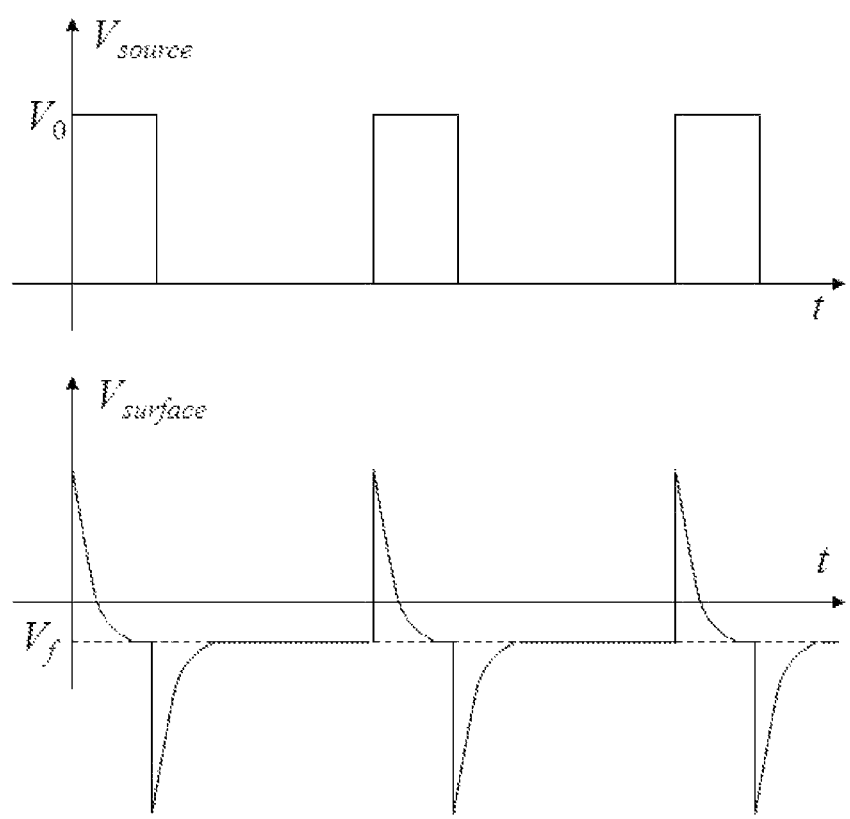
FIG. 2 shows the pulses waveforms of the power output ($V_{source}$) and the surface of the coated grid mesh ($V_{surface}$).

Generally, in the coating process, the surface of the grid mesh 1 is also coated by a layer of dielectric coating material, forming a capacitor between the grid mesh and the plasma. Therefore, the electric potential of the outer surface of the coating layer on the grid mesh is different from that of the mesh which equals to the output of the pulse power source. The pulses waveforms of the power output ($V_{source}$) and the surface of the coated grid mesh ($V_{surface}$) are shown in FIG. 2. In the pulse-off period, the surface of the coated grid mesh is generally at the plasma floating potential $V_f$, which is negative to the plasma potential $V_p$ thus prevents the plasma from passing through. When the pulse bursts on, since the voltage cross a capacitor cannot change abruptly, the potential of the surface of the coated grid mesh follows the output of the pulse power source to become a positive value, and then it drops down due to charging up of electrons until back to $V_f$. As long as the surface potential of the coated grid mesh being higher than $V_p$, which in general is about 10 V higher than $V_f$, the plasma can pass through the mesh. When the pulse bursts off, a negative burst of the surface potential of the coated grid mesh occurs, but it has little influence on the plasma control.

The surface potential of the coated grid mesh $V_{surface}$ changing with time t can be expressed as: $V_{surface}=V_0-(V_0-V_f)\exp(-t/RC)$, where $V_0$ is the amplitude of the applied pulse, R is the resistance of the plasma, and C is the capacitance of the coated layer. The pulse width of $V_{surface}$ can be defined by t at $V_{surface}=V_p$. In the process, R is related to the plasma state which is generally constant; C decreases as the coated layer getting thicker, thus from the equation, the pulse width of $V_{surface}$ will decrease continuously for a fixed $V_0$. To remain a constant pulse width of $V_{surface}$, $V_0$ should be increased continuously.

Figure 3:
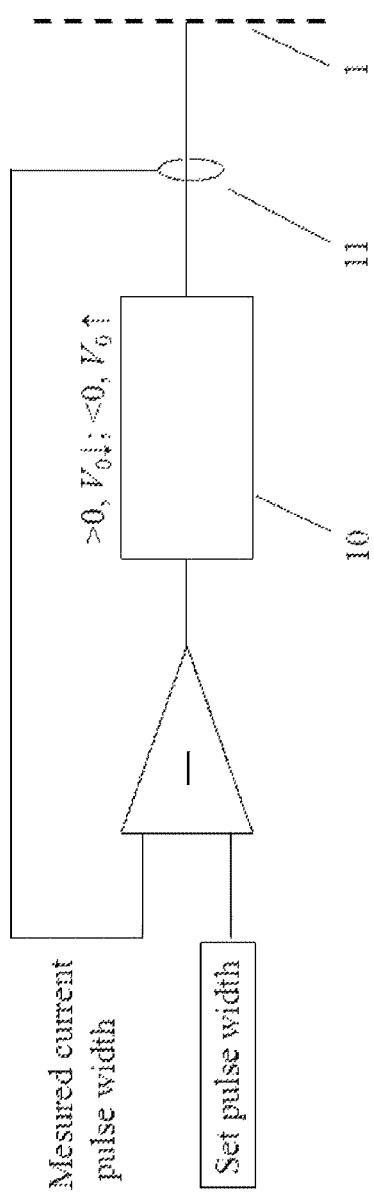
FIG. 3 shows flow chart of pulse current.

The pulse width of $V_{surface}$ is monitored and $V_0$ is adjusted to remain to be equal to the set value. To solve the problem that $V_{surface}$ is difficult to measure, the pulse current to the mesh has the same form and width to $V_{surface}$, thus it is used for the control. The flow chart is shown in FIG. 3.

What is claimed is:

1. An apparatus for initiated vapor polymerization surface coating by grid-controlled plasma, comprising a vacuum chamber divided into a discharging cavity and a processing chamber by a metal mesh grid;
   wherein the metal mesh grid is connected with a pulse bias power supply by a current sensor; the metal mesh grid is insulated from the vacuum chamber; the current sensor measures a waveform of a current pulse and feeds it back to the pulse bias power supply;
   wherein the discharging cavity in which plasma is generated is respectively connected with a carrier gas pipeline flowing carrier gas into the discharging cavity and a filament electrode; the filament electrode is connected with a power supply;
   wherein a side of the processing chamber away from the discharging cavity, where a to-be-processed base material is placed, is connected with one end of an exhaust pipe; the other end of the exhaust pipe is connected with a vacuum pump; a side of the processing chamber which is near the discharging cavity is directly connected with a monomer vapor pipeline flowing monomer vapor into the processing chamber, wherein the monomer vapor pipeline includes an outlet directly in the processing chamber, which is configured to not have a filament electrode, to feed the monomer vapor, and the metal mesh grid is separately provided from the outlet of the monomer vapor pipeline;
   wherein the processing chamber is connected with a vacuum exhaust hole; and
   wherein the pulse bias power supply generates positive pulse bias applying on the metal mesh grid and adjusts a potential of the metal mesh grid to control and release the plasma entering the processing chamber to initiate the monomer vapor to polymerize and deposit on a surface of the to-be-processed base material to form a polymer coating.

2. The apparatus for initiated vapor polymerization surface coating by grid-controlled plasma according to claim 1, wherein the metal mesh grid is made by weaving ordinary steel wire or stainless steel wire of nickel wire or copper wire or made by drilling holes on ordinary steel sheet or stainless steel sheet or nickel sheet or copper sheet; the diameter of a mesh wire of the metal mesh grid is 0.02-0.5 mm; and the size of meshes is 0.1-1 mm.

3. A method for initiated vapor polymerization surface coating by using the apparatus for initiated vapor polymerization surface coating by grid-controlled plasma according to claim 1, comprising the following steps:
   1) placing the to-be-processed base material in the processing chamber;
   2) flowing the carrier gas into the discharging cavity through the carrier gas pipeline, and flowing the monomer vapor into the processing chamber through the monomer steam pipeline; meanwhile, heating the filament electrode and applying high voltage by the power supply to generate continuous glow discharge in the discharging cavity, and applying positive pulse bias generated by the pulse bias power supply on the metal mesh grid;
   3) generating stable plasma by continuous discharge in the discharging cavity;
   applying positive pulse bias on the metal mesh grid to control and release the plasma entering the processing chamber to initiate the monomer vapor to polymerize and deposit on the surface of the to-be-processed base material to form a polymer coating,
   wherein a structural unit of the monomer at least includes one unsaturated carbon bond, and one unsaturated carbon atom does not include a substituent group; and
   the performance of the formed polymer coating keeps consistent with the nature of a characteristic functional group in the monomer structure.

4. The method for initiated vapor polymerization surface coating by grid-controlled plasma according to claim 3, wherein the monomer comprises one or more of vinyl silane, vinyl alkane, acrylate alkane and methacrylate alkane.

5. The method for initiated vapor polymerization surface coating by grid-controlled plasma according to claim 3, wherein the monomer structure includes halogen functional groups or other functional groups; the halogen functional groups are one or more of F, C, Br and I; and
other functional groups are one or more of a hydroxyl group, a carboxyl group, an epoxy group and a silica group.

6. The method for initiated vapor polymerization surface coating by grid-controlled plasma according to claim 3, wherein the plasma is generated through one or a combination of alternative voltage, radio frequency inductively coupling, microwave, filament and hot cathode.

7. The method for initiated vapor polymerization surface coating by grid-controlled plasma according to claim 3, wherein the positive pulse bias has the amplitude of 10-150 V and the pulse of 10-100 μs.

8. The method for initiated vapor polymerization surface coating by grid-controlled plasma according to claim 3, wherein the carrier gas is one or a mixture of more of hydrogen, nitrogen, helium and argon.

9. The method for initiated vapor polymerization surface coating by grid-controlled plasma according to claim 3, wherein the to-be-processed base material is one or a combination of more of plastics, rubber, an epoxy glass fiber board, a polymer coating, metal, paper, timber, glass and fabric; the surface of the to-be-processed base material has a chemical coating; and the chemical coating is one of an acrylic resin coating, an alkyd resin coating and a polyurethane coating.

10. The method for initiated vapor polymerization surface coating by grid-controlled plasma according to claim 3, wherein the characteristic functional group has natures of hydrophile, oleophobicity, acid base resistance and biological compatibility, or is used as a continuous blocking membrane for delaying corrosion.

11. The method for initiated vapor polymerization surface coating by grid-controlled plasma according to claim 4, wherein the monomer structure includes halogen functional groups or other functional groups; the halogen functional groups are one or more of F, C, Brand I; and
other functional groups are one or more of a hydroxyl group, a carboxyl group, an epoxy group and a silica group.

12. The method for initiated vapor polymerization surface coating by grid-controlled plasma according to claim 4, wherein the plasma is generated through one or a combination of alternative voltage, radio frequency inductively coupling, microwave, filament and hot cathode methods.

13. The method for initiated vapor polymerization surface coating by grid-controlled plasma according to claim 4, wherein the positive pulse bias has the amplitude of 10-150 V and the pulse of 10-100 μs.

14. The method for initiated vapor polymerization surface coating by grid-controlled plasma according to claim 4, wherein the carrier gas is one or a mixture of more of hydrogen, nitrogen, helium and argon.

15. The method for initiated vapor polymerization surface coating by grid-controlled plasma according to claim 4, wherein the to-be-processed base material is one or a combination of more of plastics, rubber, an epoxy glass fiber board, a polymer coating, metal, paper, timber, glass and fabric; the surface of the to-be-processed base material has a chemical coating; and the chemical coating is one of an acrylic resin coating, an alkyd resin coating and a polyurethane coating.

16. The method for initiated vapor polymerization surface coating by grid-controlled plasma according to claim 4, wherein the characteristic functional group has natures of hydrophile, oleophobicity, acid base resistance and biological compatibility, or is used as a continuous blocking membrane for delaying corrosion.

* * * * *